(12) United States Patent
Lu et al.

(10) Patent No.: US 8,164,084 B2
(45) Date of Patent: Apr. 24, 2012

(54) LIGHT-EMITTING DEVICE

(75) Inventors: Chi-Wei Lu, Taoyuan County (TW); Meng-Lun Tsai, Taoyuan County (TW)

(73) Assignee: Epistar Corporation, Hsinchu (TW)

( * ) Notice: Subject to any disclaimer, the term of this patent is extended or adjusted under 35 U.S.C. 154(b) by 216 days.

(21) Appl. No.: 12/536,252

(22) Filed: Aug. 5, 2009

(65) Prior Publication Data
US 2010/0032648 A1 Feb. 11, 2010

(30) Foreign Application Priority Data
Aug. 6, 2008 (TW) .............................. 97130162 A

(51) Int. Cl.
*H01L 33/00* (2010.01)
(52) U.S. Cl. ...... 257/13; 257/94; 257/103; 257/E33.005
(58) Field of Classification Search ............ 257/79, 257/96, 13, 94, 103, 98, E29.096, 33.005, 257/E33.068
See application file for complete search history.

(56) References Cited

U.S. PATENT DOCUMENTS

| 7,456,435 B2* | 11/2008 | Aoyagi et al. ............ 257/97 |
| 2004/0227141 A1* | 11/2004 | Jou et al. ............ 257/79 |
| 2006/0175628 A1* | 8/2006 | Otsuka et al. ............ 257/103 |
| 2007/0068572 A1* | 3/2007 | Fetzer et al. ............ 136/262 |
| 2007/0187712 A1* | 8/2007 | Yamada et al. ............ 257/103 |
| 2008/0073658 A1* | 3/2008 | Wirth ............ 257/96 |

FOREIGN PATENT DOCUMENTS

| CN | 1433578 A | 7/2003 |
| CN | 101010811 A | 8/2007 |
| CN | 101188262 A | 5/2008 |
| CN | 101490604 | 7/2009 |
| CN | 101656280 | 2/2010 |

* cited by examiner

*Primary Examiner* — Victor A Mandala
*Assistant Examiner* — Whitney T Moore
(74) *Attorney, Agent, or Firm* — Muncy, Geissler Olds & Lowe, PLLC

(57) ABSTRACT

A light-emitting device with a tunneling structure and a current spreading layer is disclosed. It includes an electrically conductive permanent substrate, an adhesive layer, an epitaxial structure, a tunneling structure and a current spreading layer. The adhesive layer is on the electrically conductive permanent substrate. The epitaxial structure on the adhesive layer at least comprises an upper cladding layer, an active layer, and a lower cladding layer. The tunneling structure on the epitaxial structure comprises a first conductivity type semiconductor layer with a first doping concentration and a second conductivity type semiconductor layer with a second doping concentration. The current spreading layer is on the tunneling structure.

10 Claims, 12 Drawing Sheets

US 8,164,084 B2

LIGHT-EMITTING DEVICE

CROSS REFERENCE TO RELATED APPLICATIONS

This application claims the right of priority based on Taiwan Patent Application No. 097130162 entitled "Light-Emitting Device", filed on Aug. 6, 2008, which is incorporated herein by reference and assigned to the assignee herein.

TECHNICAL FIELD

The present application generally relates to a light-emitting device, and more particularly to a light-emitting device comprising a tunneling structure and a current spreading layer.

BACKGROUND

Light-emitting devices such as light-emitting diodes (LEDs) have widely application, like optical display device, traffic lighting, data storage device, communication device, illumination device, and medical device. How to enhance the brightness of the light-emitting diodes is an important topic in the field.

In a generally-known technology, a layer with the material of a band-gap greater than that of the active layer is formed on the p-cladding layer (the material is p-$Al_{0.5}In_{0.5}P$), such as p-$Al_{0.7}Ga_{0.3}As$ or p-GaP window layer, to increase the light extraction efficiency in the AlGaInP material series light-emitting diode having a p-electrode on the top. In order to enhance the current spreading efficiency, the thickness of the window layer can be increased, such as a 7 μm p-$Al_{0.7}Ga_{0.3}As$ layer, or a 50 μm p-GaP layer by HVPE.

In the classic mechanics, a particle having the lower potential energy can not jump over the energy barrier to another side unless its kinetics energy exceeds the energy barrier. However, from the view of quantum physics, it is possible. The tunneling effect is that a particle can pass the energy barrier higher than the total energy of its own. The tunneling structure normally has a high doping concentration of impurity to increase the mobility of the electrons and/or holes. To increase the tunneling effect probability of the electrons and holes, the tunneling structure thickness needs to be very thin also.

SUMMARY

The present application is to provide a light-emitting device having a tunneling structure and the method for manufacturing of the same. The tunneling structure includes a first conductivity type semiconductor layer with a first doping concentration and a second conductivity type semiconductor layer with a second doping concentration.

The present application is to provide a light-emitting device having a tunneling structure and the method for manufacturing of the same. The range of the thickness of the first conductivity type semiconductor layer in the tunneling structure is 100 to 500 angstroms, and the range of the first doping concentration of the first conductivity type semiconductor layer in the tunneling structure is $6\times10^{19}/cm^3$ to $1\times10^{20}/cm^3$.

The present application is to provide a light-emitting device having a tunneling structure and the method for manufacturing of the same. The range of the thickness of the second conductivity type semiconductor layer in the tunneling structure is 100 to 500 angstroms, and the range of the second doping concentration of the second conductivity type semiconductor layer in the tunneling structure is $6\times10^{19}/cm^3$ to $3\times10^{20}/cm^3$.

The present application is to provide a light-emitting device having a current spreading layer and the method for manufacturing of the same to enhance the lateral current spreading efficiency.

The present application is to provide a light-emitting device having a current spreading layer and the method for manufacturing of the same. The current spreading layer is formed on a tunneling structure. It can decrease the forward voltage and increase the brightness of the light-emitting diode because of the improved electrical connection between the tunneling structure and the current spreading layer.

The present application is to provide a light-emitting device having a current spreading layer and the method for manufacturing of the same. The current spreading layer is formed on the tunneling structure to achieve a better current spreading effect.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
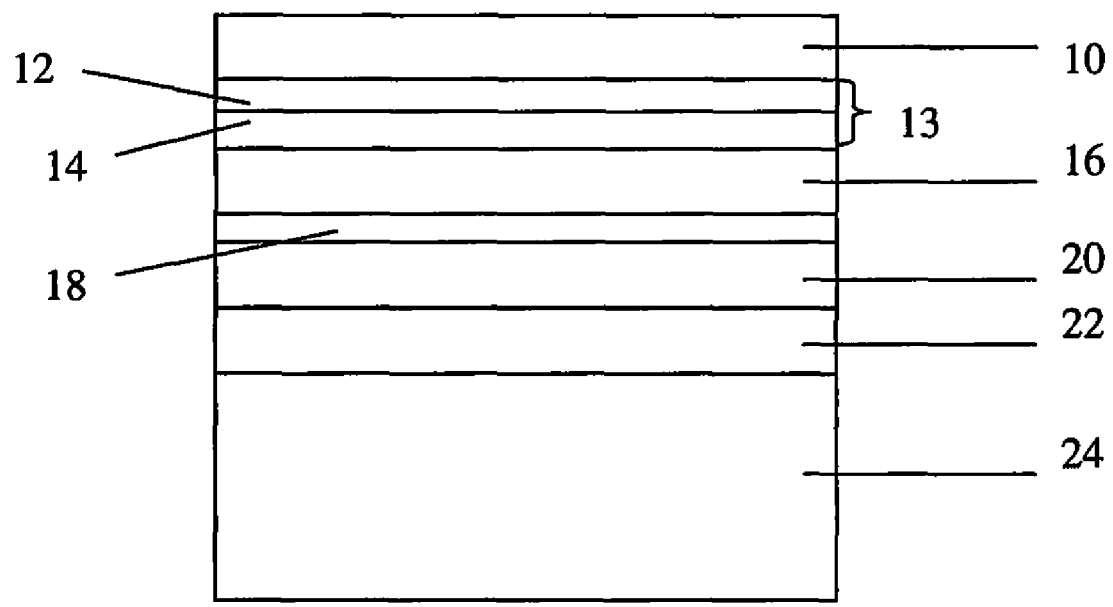
FIGS. 1-5 illustrate a process flow of forming a light-emitting device in accordance with one embodiment of the present application.

The first embodiment of the present application is illustrated in FIG. 1 to FIG. 5. Referring to FIG. 1, the structure of a light-emitting device 100 in this embodiment includes an opaque growth substrate 24, for example, n-GaAs. An epitaxial structure on the opaque growth substrate includes an etching stop layer 22; a lower cladding layer 20 wherein the material of the lower cladding layer 20 can be n-type $Al_xIn_{1-x}P$; an active layer 18 wherein the material of the active layer can be $(Al_xGa_{1-x})_{0.5}In_{0.5}P$; and an upper cladding layer 16 wherein the material of the upper cladding layer can be p-type $Al_xIn_{1-x}P$. A tunneling structure 13 is on the epitaxial structure, including a first conductivity type semiconductor layer 14 with a first doping concentration and a second conductivity type semiconductor layer 12 with a second doping concentration, for example, the material of the first conductivity type semiconductor layer 14 is $p^+$-$Al_xIn_{1-x}P$ (the thickness is about 100-500 angstroms, and the doping concentration is $6\times10^{19}/cm^3$-$1\times10^{20}/cm^3$) and the material of the second conductivity type semiconductor layer 12 is $n^+$-$Al_xIn_{1-x}P$ (the thickness is about 100-500 angstroms, and the doping concentration is $6\times10^{19}/cm^3$-$1\times10^{20}/cm^3$). A current spreading layer 10 is on the tunneling structure 13, and the material of the current spreading layer can be n-type $Al_xIn_{1-x}P$. When the doping concentration of n-type $Al_xIn_{1-x}P$ is $1\times10^{18}/cm^3$, the electron mobility is 211 $cm^2/Vsec$, which is higher than the generally-known material such as n-type $Al_{0.7}Ga_{0.3}As$ (the electron mobility is 151 $cm^2/Vsec$ when the doping concentration is $1\times10^{18}/cm^3$) and n-type GaP (the electron mobility is 125 $cm^2/Vsec$ when the doping concentration is $1\times10^{18}/cm^3$), so the current spreading effect is better. Furthermore, $Al_xIn_{1-x}P$ is an indirect band gap material so it can reduce the absorption of the light emitted from the active layer.

The material of the etching stop layer 22 can be any III-V group element compound semiconductors as long as its lattice constant is substantially matched with that of the opaque growth substrate 24, and the etching rate is much lower than that of the opaque growth substrate 24. A material of the etching stop layer in this embodiment is InGaP or AlGaAs. If the lower cladding layer 20 etching rate is much lower than that of the opaque growth substrate 24 and its thickness is sufficient, it can act as an etching stop layer so it is not necessary to form another etching stop layer.

Figure 2:
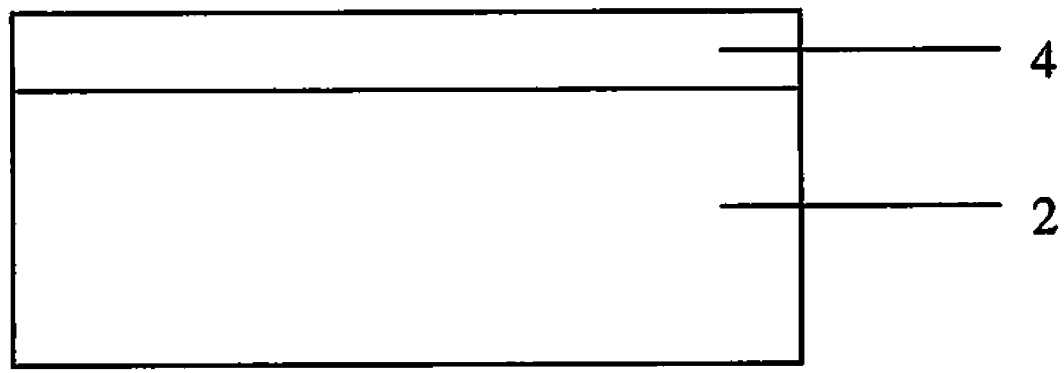

The present application is to provide another structure as shown in FIG. 2. The structure includes a temporary substrate 2 and a connecting layer 4. The material of the temporary substrate 2 can be sapphire, glass, GaP, GaAsP, ZnSe, ZnS, or ZnSSe. The connecting layer 4 can be a polymer adhesive layer with a material like epoxy, polyimide, perfluorocyclobutane, benzocyclobutene, spin-on glass, or silicone. The material of the connecting layer 4 can also comprise electrically conductive material like solder, low temperature metal, metal silicone, spontaneous conductive polymer or polymer doped aluminum, gold, platinum, zinc, silver, nickel, germanium, indium, tin, titanium, lead, copper, palladium or the alloys thereof.

Next, a light emitting diode with a current spreading layer 10 shown in FIG. 1 is attached to the temporary substrate 2 as shown in FIG. 2 by disposing the current spreading layer 10 facing the connecting layer 4. The opaque substrate 24 is removed and then the lower cladding layer 20 is exposed by etching with the etching solution (for example: $5H_3PO_4$: $3H_2O_2$:$3H_2O$ or $1NH_4OH$:$35H_2O_2$). If the material of the etching stop layer 22 is InGaP or AlGaAs, it has to be removed because it can absorb the light emitted from the active layer. The structure formed accordingly is shown in FIG. 3.

Figure 4:
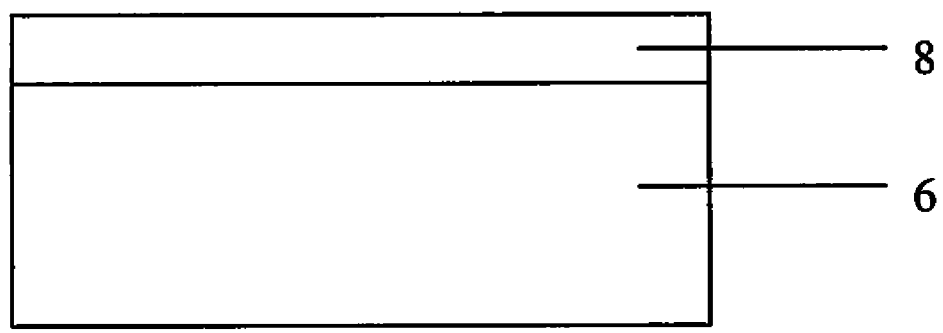

Another structure as shown in FIG. 4 is provided. It includes an electrically conductive permanent substrate 6 and an adhesive layer 8. The material of the electrically conductive permanent substrate 6 can be silicon, copper, aluminum, molybdenum, gold, silver, or silicon carbide. The material of the adhesive layer 8 can comprise electrically conductive material like solder, low temperature metal, metal silicone, spontaneous electrically conductive polymer or polymer doped aluminum, gold, platinum, zinc, silver, nickel, germanium, indium, tin, titanium, lead, copper, palladium or the alloys thereof.

Figure 3:
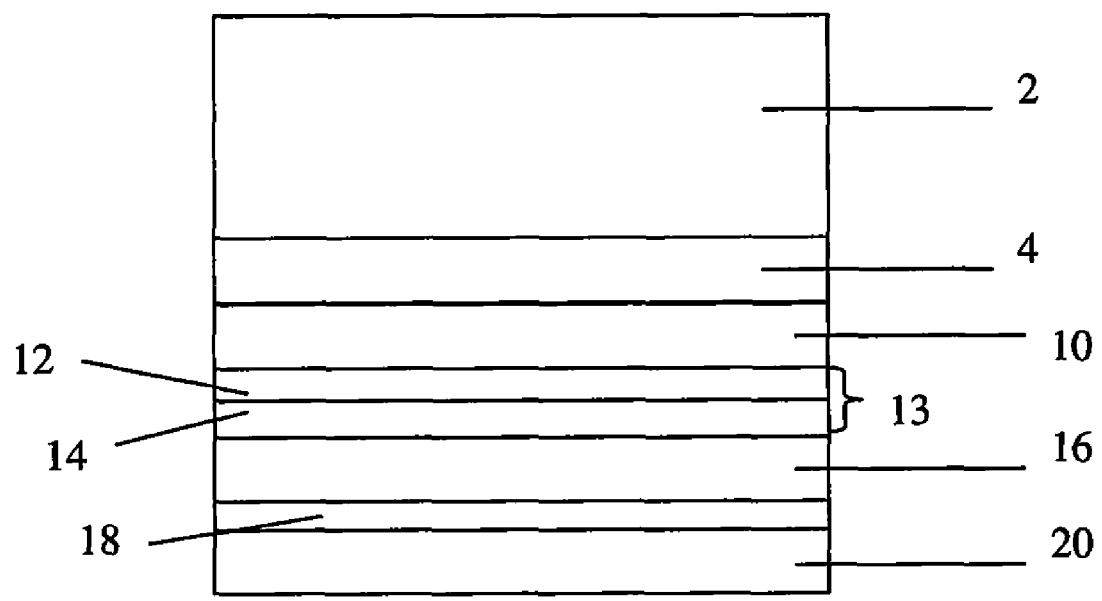
Figure 5:
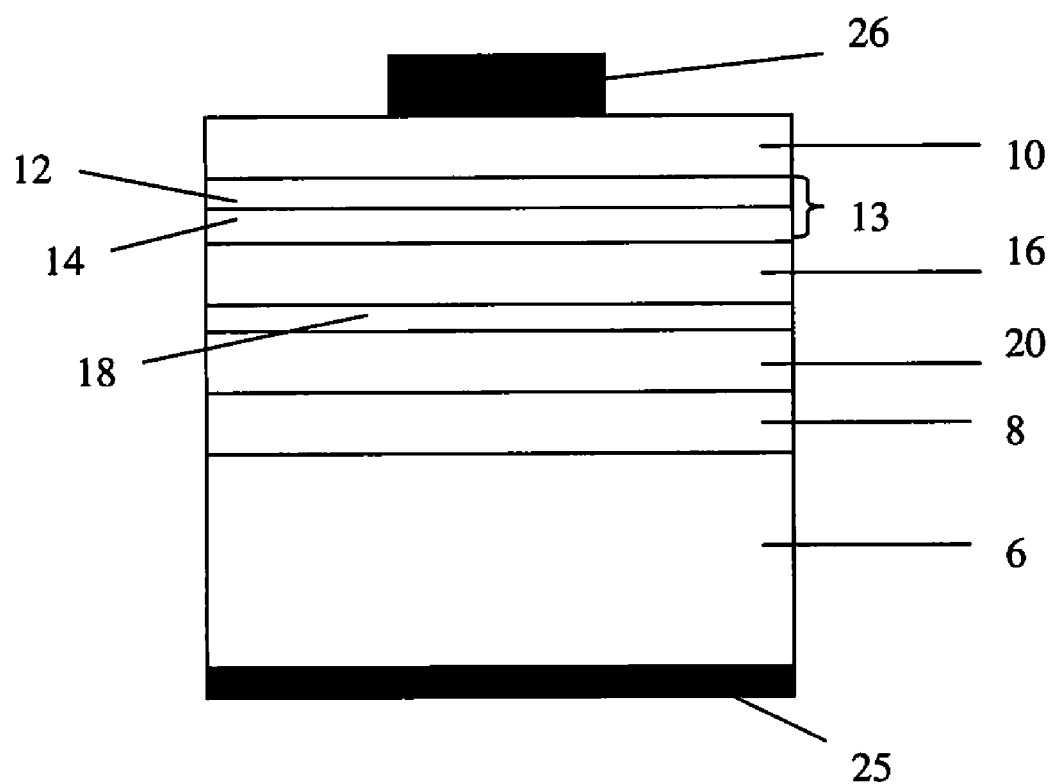

Next, a light emitting diode with a lower cladding layer 20 shown in FIG. 3 is attached to the electrically conductive permanent substrate 6 as shown in FIG. 4 by disposing the lower cladding layer 20 facing the adhesive layer 8. The temporary substrate 2 and the connecting layer 4 are removed (not shown), then the ohmic contact electrodes 25, 26 are formed below the electrically conductive permanent substrate 6 and on the current spreading layer 10 respectively. The light-emitting diode 100 formed accordingly is shown in FIG. 5.

Figure 6:
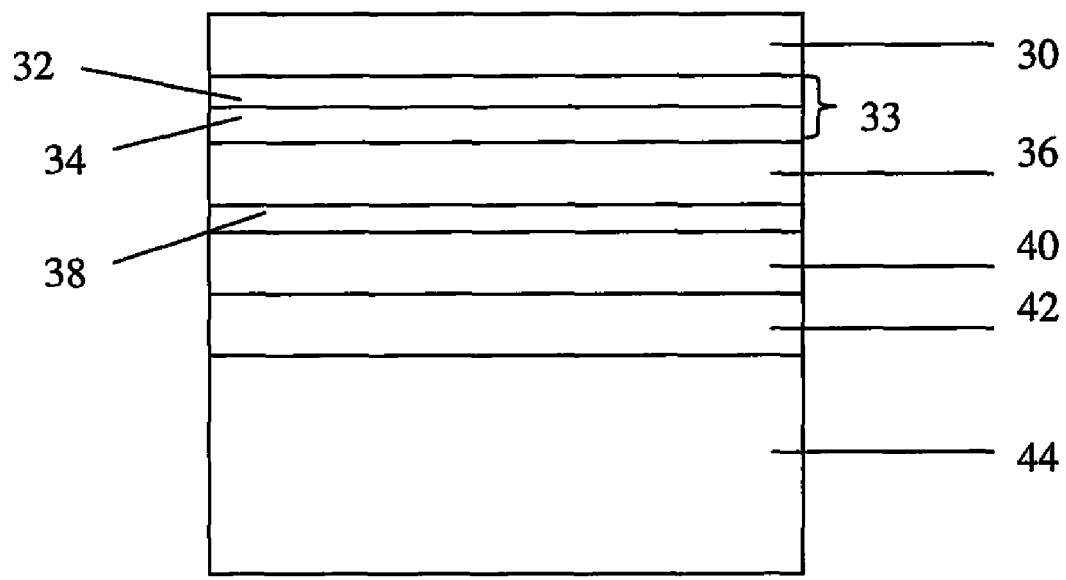
FIGS. 6-12 illustrate a process flow of forming a light-emitting device in accordance with another embodiment of the present application.

The second embodiment of the present application is illustrated in FIG. 6 to FIG. 12. Referring to FIG. 6, the structure of a light-emitting device 200 in this embodiment includes a transparent growth substrate 44, for example, sapphire. An epitaxial structure on the transparent growth substrate includes a buffer layer 42; a lower cladding layer 40 wherein the material of the lower cladding layer can be n-type GaN or n-type AlInN; an active layer 38 wherein the material of the active layer can be AlGaInN or InGaN; and an upper cladding layer 36 wherein the material of the upper cladding layer can be p-type GaN or p-type AlInN. A tunneling structure 33 is on the epitaxial structure, including a first conductivity type semiconductor layer 34 with a first doping concentration and a second conductivity type semiconductor layer 32 with a second doping concentration, for example, the material of the first conductivity type semiconductor layer 34 is $p^+$-$Al_xIn_{1-x}N$ or $p^+$-GaN (the thickness is about 100-500 angstroms, and the doping concentration is $6\times10^{19}/cm^3$-$1\times10^{20}/cm^3$) and the material of the second conductivity type semiconductor layer 32 is $n^+$-$Al_xIn_{1-x}N$ or $n^+$-GaN (the thickness is about 100-500 angstroms, and the doping concentration is $2\times10^{20}/cm^3$-$3\times10^{20}/cm^3$). A current spreading layer 30 is on the tunneling structure 33, and the material of the current spreading layer can be n-type $Al_xIn_{1-x}N$ or n-type GaN.

Figure 7:
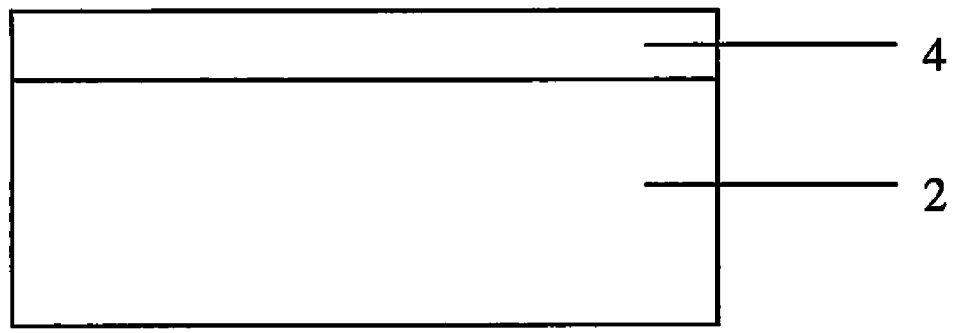

The present application is to provide another structure as shown in FIG. 7. The structure includes a temporary substrate 2 and a connecting layer 4. The material of the temporary substrate 2 can be glass, GaP, GaAsP, ZnSe, ZnS, or ZnSSe. The connecting layer 4 can be a polymer adhesive layer with a material like epoxy, polyimide, perfluorocyclobutane, benzocyclobutene, spin-on glass, or silicone. The material of the connecting layer 4 can also comprise electrically conductive material like solder, low temperature metal, metal silicone, spontaneous electrically conductive polymer or polymer doped aluminum, gold, platinum, zinc, silver, nickel, germanium, indium, tin, titanium, lead, copper, palladium or the alloys thereof.

Next, a light emitting diode with a current spreading layer 30 shown in FIG. 6 is attached to the temporary substrate 2 as shown in FIG. 7 by disposing the current spreading layer 30 facing the connecting layer 4. The transparent growth substrate 44 and the buffer layer 42 are removed then the lower cladding layer 40 is exposed by etching with the etching solution or laser. The structure formed accordingly is shown in FIG. 8.

Figure 9:
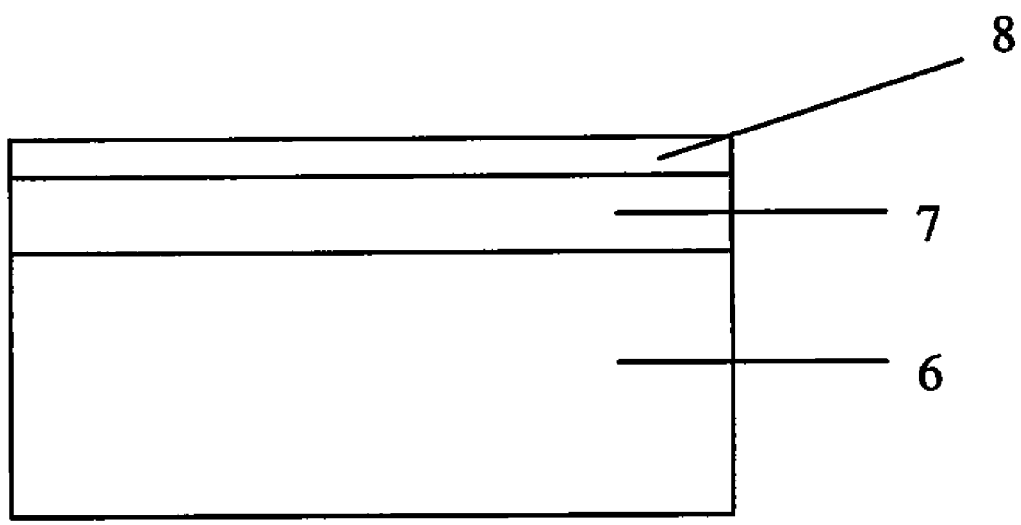

Another structure as shown in FIG. 9 is provided. It includes an electrically conductive permanent substrate 6, an isolation layer 7 and an adhesive layer 8. The material of the electrically conductive permanent substrate 6 can be silicon, copper, aluminum, molybdenum, gold, silver, or silicon carbide. The isolation layer 7 is a single-layer or multiple-layers structure, and the material can be aluminum oxide, silicon oxide, silicon nitride, or aluminum nitride. The adhesive layer 8 can be a polymer adhesive layer. The material of the adhesive layer is epoxy, polyimide, perfluorocyclobutane, benzocyclobutene, spin-on glass, or silicone. The material of the adhesive layer can comprise electrically conductive material like solder, low temperature metal, metal silicone, spontaneous electrically conductive polymer or polymer doped aluminum, gold, platinum, zinc, silver, nickel, germanium, indium, tin, titanium, lead, copper, palladium or the alloys thereof.

Figure 8:
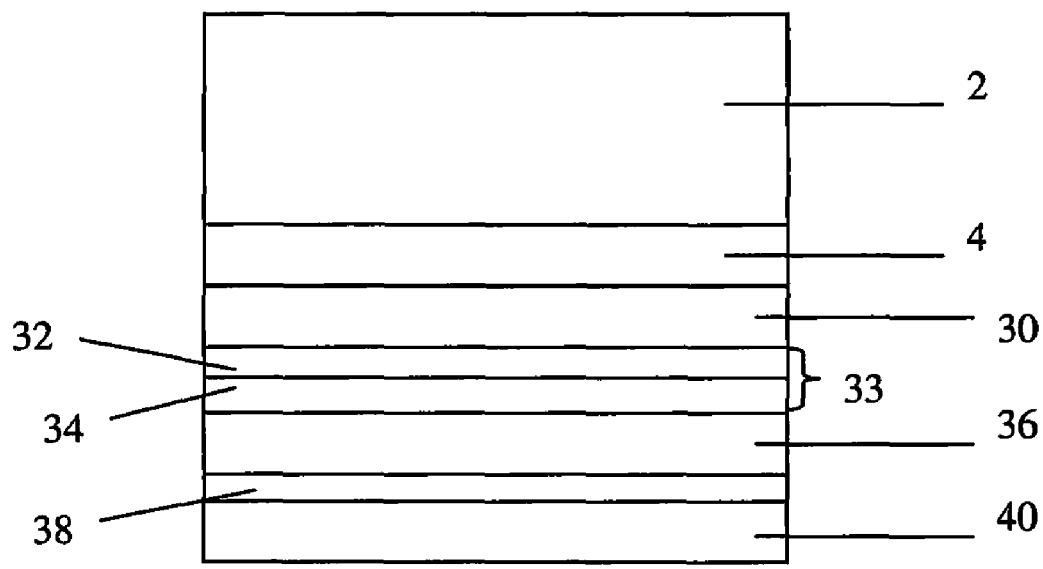
Figure 10:
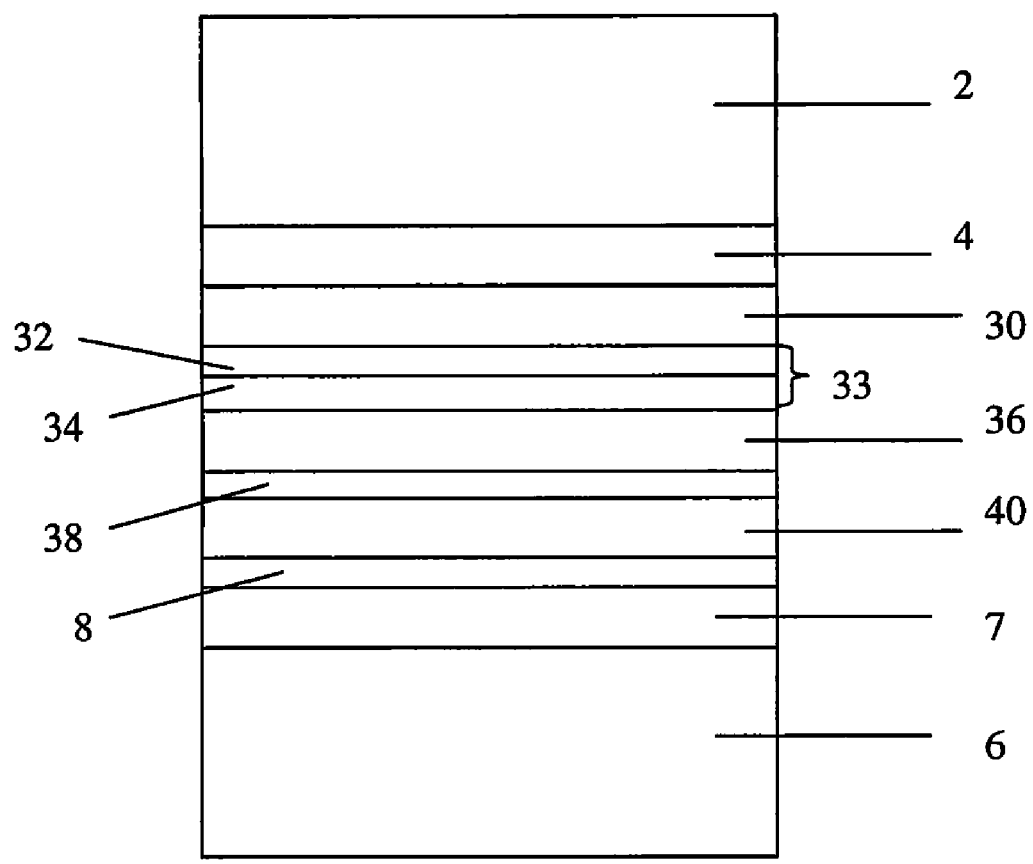
Figure 11:
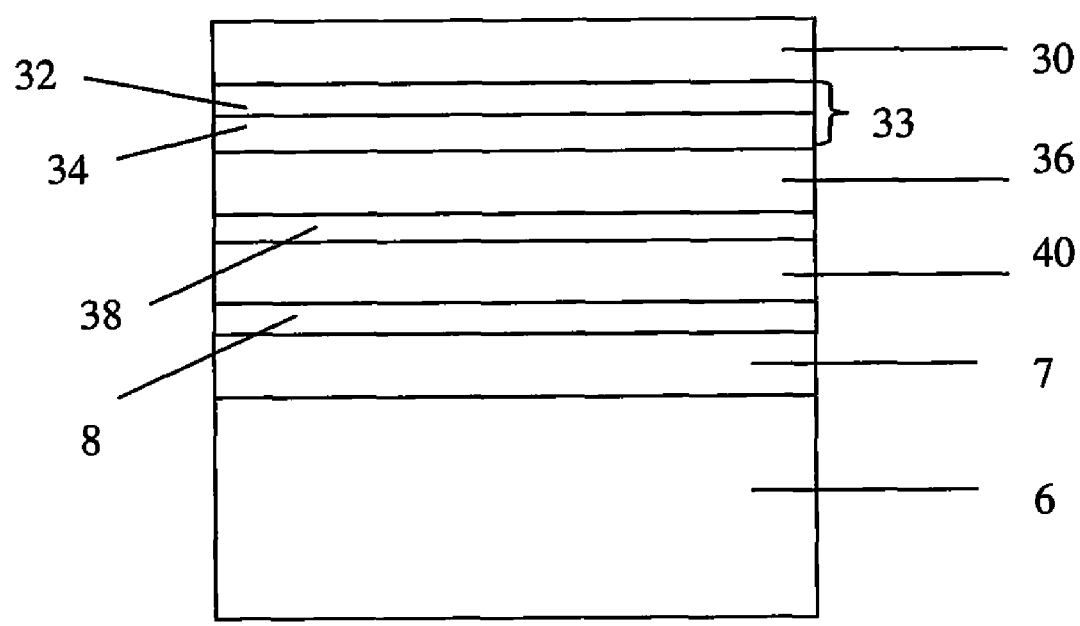
Figure 12:
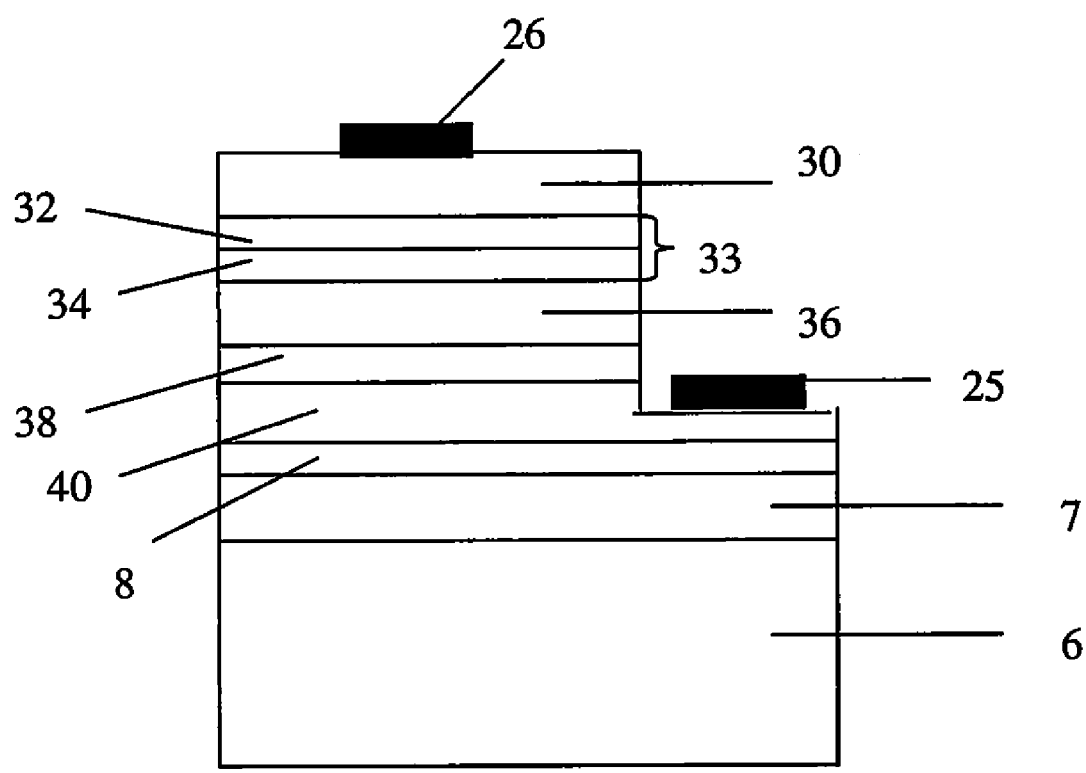

Next, a light emitting diode with a lower cladding layer 40 shown in FIG. 8 is attached to the electrically conductive permanent substrate 6 as shown in FIG. 9 by disposing the lower cladding layer 40 facing the adhesive layer 8 as shown in FIG. 10. The temporary substrate 2 and the connecting layer 4 are removed (as FIG. 11 shown), then the upper surface of the current spreading layer 30 is exposed. The portion of the current spreading layer 30, the second conductivity type semiconductor layer 32 with a second doping concentration, the first conductivity type semiconductor layer 34 with a first doping concentration, the upper cladding layer 36, the active layer 38 and the lower cladding layer 40 are etched and removed in sequence, then the portion of the lower cladding layer 40 is exposed. Next, the ohmic contact electrodes 25, 26 are formed on the lower cladding layer 40 and on the current spreading layer 30 respectively. The light-emitting diode 200 formed accordingly is shown in FIG. 12.

Other embodiments of the application will be apparent to those having ordinary skills in the art from consideration of the specification and practice of the invention disclosed herein. It is intended that the specification and examples be considered as exemplary only, with a true scope and spirit of the invention being indicated by the following claims.

We claim:

1. A light-emitting device, comprising:
an electrically conductive permanent substrate;
an adhesive layer on the electrically conductive permanent substrate;
an epitaxial structure on the adhesive layer connected with the electrically conductive permanent substrate by the adhesive layer, wherein the epitaxial structure comprises:
a lower cladding layer, wherein the material of the lower cladding layer comprises AlInN;
an active layer on the lower cladding layer, wherein the material of the active layer comprises InGaN or AlGaInN; and
an upper cladding layer on the active layer, wherein the material of the upper cladding layer comprises AlInN;
a tunneling structure on the epitaxial structure, comprising
a first conductivity type semiconductor layer comprising AlInN with a first doping concentration greater than $6\times10^{19}/cm^3$; and
a second conductivity type semiconductor layer comprising AlInN with a second doping concentration greater than $6\times10^{19}/cm^3$ on the first conductivity type semiconductor layer, wherein the second conductivity type is different from the first conductivity type; and
a current spreading layer on the tunneling structure.

2. The light-emitting device according to claim 1, wherein the range of the thickness of the first conductivity type semiconductor layer in the tunneling structure is about 100 to 500 angstroms, and the range of the first doping concentration of the first conductivity type semiconductor layer in the tunneling structure is about $6\times10^{19}/cm^3$ to $1\times10^{20}/cm^3$.

3. The light-emitting device according to claim 1, wherein the range of the thickness of the second conductivity type semiconductor layer in the tunneling structure is about 100 to 500 angstroms, and the range of the second doping concentration of the second conductivity type semiconductor layer in the tunneling structure is about $2\times10^{20}/cm^3$ to $3\times10^{20}/cm^3$.

4. The light-emitting device according to claim 1, wherein the material of the current spreading layer is n-GaN or n-AlInN.

5. The light-emitting device according to claim 4, wherein the range of the thickness of the current spreading layer is about 0.1 to 5 micrometers.

6. A light-emitting device, comprising:
an epitaxial structure comprising a lower cladding layer comprising n-AlInN, an active layer comprising InGaN or AlGaInN on the lower cladding layer, and an upper cladding layer comprising p-AlInN on the active layer;
a tunneling structure on the epitaxial structure comprising a p-AlInN layer with a first doping concentration greater than $6\times10^{19}/cm^3$, and an n-AlInN layer with a second doping concentration greater than $6\times10^{19}/cm^3$ on the p-AlInN layer; and
a current spreading layer comprising n-AlInN on the tunneling structure.

7. The light-emitting device according to claim 6, wherein the thickness of the p-AlInN layer in the tunneling structure is about 100 to 500 angstroms, and the first doping concentration of the p-AlInN layer in the tunneling structure is about $6\times10^{19}/cm^3$ to $1\times10^{20}/cm^3$.

8. The light-emitting device according to claim 6, wherein the thickness of the n-AlInN layer in the tunneling structure is about 100 to 500 angstroms, and the second doping concentration of the n-AlInN layer in the tunneling structure is about $2\times10^{20}/cm^3$ to $3\times10^{20}/cm^3$.

9. The light-emitting device according to claim 6, further comprising:
an electrically conductive permanent substrate; and
an adhesive layer connected with the electrically conductive permanent substrate and the epitaxial structure.

10. The light-emitting device according to claim 6, wherein the thickness of the current spreading layer is about 0.1 to 5 micrometers.

* * * * *